United States Patent [19]

Poon et al.

[11] Patent Number: 4,978,626
[45] Date of Patent: Dec. 18, 1990

[54] LDD TRANSISTOR PROCESS HAVING DOPING SENSITIVE ENDPOINT ETCHING

[75] Inventors: Stephen S. Poon; James R. Pfiester; Frank K. Baker; Jeffrey L. Klein, all of Austin, Tex.

[73] Assignee: Motorola, Inc., Schaumburg, Ill.
[21] Appl. No.: 240,013
[22] Filed: Sep. 2, 1988
[51] Int. Cl.[5] .................. H01L 21/265; H01L 21/28; H01L 27/092
[52] U.S. Cl. .................... 437/44; 437/27; 437/34; 437/41; 437/57; 437/191; 437/233; 437/29; 437/30; 357/23.3; 357/59; 156/643; 156/646; 156/650; 156/653
[58] Field of Search ............ 437/27, 41, 44, 56, 437/57, 191, 233, 228, 229, 238, 189, 192, 193, 194, 46, 34, 29, 30; 357/23.3, 23.4, 596; 156/643, 646, 650, 651, 652, 653

[56] References Cited

U.S. PATENT DOCUMENTS

| | | |
|---|---|---|
| 4,249,968 | 2/1981 | Gardiner et al. ............ 437/191 |
| 4,354,309 | 10/1982 | Gardiner et al. ............ 437/191 |
| 4,358,338 | 11/1982 | Downey et al. ............ 156/643 |
| 4,377,436 | 3/1983 | Donnelly et al. ............ 156/643 |
| 4,602,981 | 7/1986 | Chen et al. ............ 156/643 |
| 4,675,072 | 6/1987 | Bennett et al. ............ 156/643 |
| 4,714,519 | 12/1987 | Pfiester ............ 437/44 |
| 4,717,446 | 1/1988 | Nagy et al. ............ 156/643 |
| 4,757,026 | 7/1988 | Woo et al. ............ 437/44 |
| 4,818,715 | 4/1989 | Chao ............ 437/228 |
| 4,829,024 | 5/1989 | Klein et al. ............ 437/193 |
| 4,837,180 | 6/1989 | Chao ............ 437/229 |
| 4,843,023 | 6/1989 | Chiu et al. ............ 437/34 |
| 4,863,879 | 9/1989 | Kwok ............ 437/44 |
| 4,888,298 | 12/1989 | Rivaud et al. ............ 437/43 |
| 4,906,589 | 3/1990 | Chao ............ 437/44 |
| 4,908,326 | 3/1990 | Ma et al. ............ 437/44 |

FOREIGN PATENT DOCUMENTS

| | | | |
|---|---|---|---|
| 0085916 | 8/1983 | European Pat. Off. ............ 437/44 |
| 3813665 | 11/1988 | Fed. Rep. of Germany ........ 437/44 |
| 0070762 | 6/1979 | Japan ............ 437/44 |
| 0083267 | 6/1980 | Japan ............ 437/191 |
| 0126957 | 10/1981 | Japan ............ 437/44 |
| 0045184 | 10/1983 | Japan ............ 437/191 |
| 0110169 | 6/1984 | Japan ............ 437/44 |
| 0034068 | 2/1985 | Japan ............ 437/44 |
| 0055665 | 3/1985 | Japan ............ 437/44 |
| 0007564 | 1/1989 | Japan ............ 437/191 |
| 0133365 | 5/1989 | Japan ............ 437/34 |
| 0133366 | 5/1989 | Japan ............ 437/34 |

OTHER PUBLICATIONS

Huang et al., "A Novel Submicron LLD Transistor with Inverse-T Gate Structure", IEDM, 12/1986, pp. 742-745.
"Simultaneous Formation of Shallow-Deep Stepped Source/Drain For Sub-Micron CMOS", by C. S. Oh et al., 1988, *Symposium on VLSI Technology/Digest of Techical Papers*, pp. 73-74, May 10-13, 1988.
"A Novel Submicron LDD Transistor With Inverse-T Gate Structure", by Tiao-Yuan Huang et al., 1986 *IEEE International Electron Devices Meeting Technical Digest*, pp. 742-745, Dec. 7-10, 1986.
"The Impact of Gate-Drain Overlapped LDD (Gold) For Deep Submicron VLSI's", by Tyuichi Izawa et al., 1987 *IEEE International Electron Device Meeting Technical Digest*, pp. 38-41, Dec. 6-9, 1987.

*Primary Examiner*—Olik Chaudhuri
*Assistant Examiner*—M. Wilczewski
*Attorney, Agent, or Firm*—Robert L. King

[57] ABSTRACT

An LDD transistor is formed by using a process which insures that a layer of gate oxide is not inadvertently etched into and is not ruptured by static electrical charges. At least two thicknesses of gate electrode material of varying doping levels are formed over a layer of gate oxide which is above a semiconductor substrate. A chemical etch is utilized wherein by monitoring a ratio of chemical product and chemical reactant of the chemical etch reactions, specific endpoints in the etching of the gate electrode material can be easily detected. A small layer of gate electrode material is allowed to remain over the gate oxide layer during ion implanting and the formation and removal of gate sidewall spacers used in fabricating an LDD transistor. After formation of most of the LDD transistor, the remaining protective thickness of gate electrode material is removed and the exposed gate oxide layer is exposed to a final oxidizing anneal step. In other forms, an inverse-T gate structure LDD transistor is formed, and an LDD transistor is formed via a process having a reduced number of ion implants steps.

12 Claims, 11 Drawing Sheets

LDD TRANSISTOR PROCESS HAVING DOPING SENSITIVE ENDPOINT ETCHING

CROSS REFERENCE TO RELATED APPLICATION

Application Ser. No. 07/239,919, now U.S. Pat. No. 4,829,024, entitled "METHOD OF FORMING-LAYERED POLYSILICON FILLED CONTACT FORMED BY DOPING SENSITIVE ENDPOINT ETCHING", filed simultaneously herewith by Jeffrey L. Klein et al.

FIELD OF THE INVENTION

This invention relates generally to the field of electronic circuit fabrication techniques, and more particularly, to manufacturing lightly doped drain (LDD) transistors in integrated semiconductor circuits.

BACKGROUND OF THE INVENTION

Processes which implement lightly doped drain (LDD) structures are well known. Accordingly, reasons for using and advantages of the lightly doped drain structure are well documented. The conventional LDD process involves formation of gate sidewall spacers. A lightly doped drain region is typically implanted into a substrate prior to the formation of a sidewall spacer. The sidewall spacer is commonly formed by depositing a dielectric after the gate is formed and anisotropically etching the dielectric to create the spacer. With the sidewall spacer is place, a heavy source/drain dopant is implanted with the gate and sidewall spacer acting as a mask to provide source and drain regions laterally displaced from the gate edges by the width of the sidewall spacer. The process just detailed typically requires two or more photolithographic masking steps. When photolithographic masking steps are minimized, substantial manufacturing cost savings may be realized.

A control problem typically exists in the formation of sidewall spacers by anisotropic etching. A common dielectric material which is used for sidewall spacer formation is low temperature oxide (LTO). Due to variations in the etch and the lack of precise control in the etchback process, variations in the size of the sidewall spacers are common. In addition, damage to the edge of the gate oxide may occur during the etching reaction. The net result is that transistors with varying device characteristics may result as well as defective or inoperative transistors.

An additional problem associated with the gate oxide integrity can result from the heavy source and drain implantation step. Electrical charges created by the source and drain implant can create a large electric field across the gate oxide and possibly result in gate oxide failure and premature breakdown.

BRIEF DESCRIPTION OF THE INVENTION

Accordingly, it is an object of the present invention to provide an improved LDD transistor process having doping sensitive endpoint etching.

It is another object of the present invention to provide a process for forming an improved transistor by incompletely etching a gate electrode material via doping sensitive etching.

Yet another object of the present invention is to provide an improved method for forming an LDD transistor by etching a gate electrode material during differing portions of the process sequence.

A further object of the present invention is to provide an improved process for providing an inverse-T gate structure LDD transistor.

In carrying out these and other objects of the invention, there is provided, in one form, a process for forming a lightly doped drain transistor by using doping sensitive endpoint etching. In one form, a substrate of a first conductivity type is provided, and a well region of a second conductivity type is formed in the substrate. A layer of gate oxide is formed over the well region. A layer of polysilicon having at least two regions of differing doping concentrations in the vertical direction is deposited over the layer of gate oxide. A first region has a first thickness, and a second region has a second thickness not less than the first thickness. A gate electrode is patterned by selectively depositing a pattern forming material such as photoresist onto a predetermined portion of the layer of polysilicon. The layer of polysilicon is selectively etched by either a wet or a dry chemical etch reaction to form the gate electrode. The layer of polysilicon which is adjacent to each side of the gate region is exposed. The doping sensitive endpoint is implemented by monitoring a ratio of a chemical product and a chemical reactant of the chemical etch reaction. A change in value of the ratio is detected upon completion of etching the second region of the polysilicon and the beginning of etching of the first region. A lightly doped drain transistor is then formed around the gate electrode by selectively implanting heavily and lightly doped source/drain regions of the first conductivity type. The first region of polysilicon is then etched to expose the layer of gate oxide. The exposed surfaces of the lightly doped drain transistor are subsequently oxidized.

These and other objects, features and advantages will be more clearly understood from the following detailed description taken in conjunction with the accompanying drawings.

DETAILED DESCRIPTION OF THE INVENTION

Figure 1A:
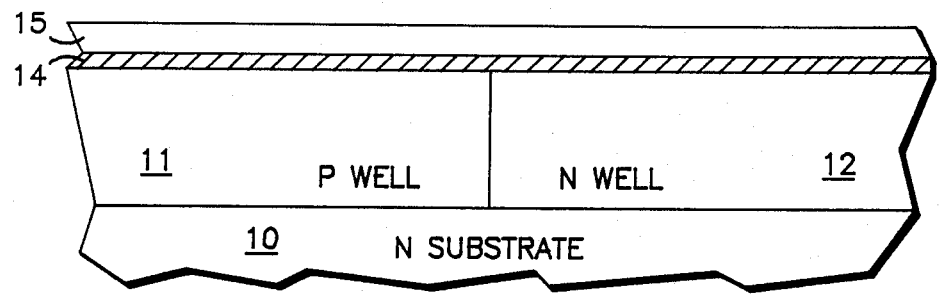
FIGS. 1(A)-(I) illustrate in cross-sectional diagram form the fabrication of an LDD transistor in accordance with the present invention.

Shown in FIG. 1(A) is a cross-sectional view of a semiconductor structure having a polysilicon substrate 10 of N-conductivity. A P-conductivity well region 11 is formed in substrate 10, and an N-conductivity well region 12 is formed in substrate 10. It should be readily understood that well regions 11 and 12 are electrically isolated from each other, and are illustrated adjacent one another solely for the purposes of illustration. A gate oxide layer 14 is uniformly deposited over P-well region 11 and N-well region 12. Above the layer of gate oxide 14 is deposited a layer of undoped polysilicon 15. In the illustrated form, the layers of gate oxide 14 and undoped polysilicon 15 are planar. Although the thickness of the layer of undoped polysilicon 15 may vary, an exemplary thickness of undoped polysilicon 15 is five hundred angstroms.

Figure 1B:
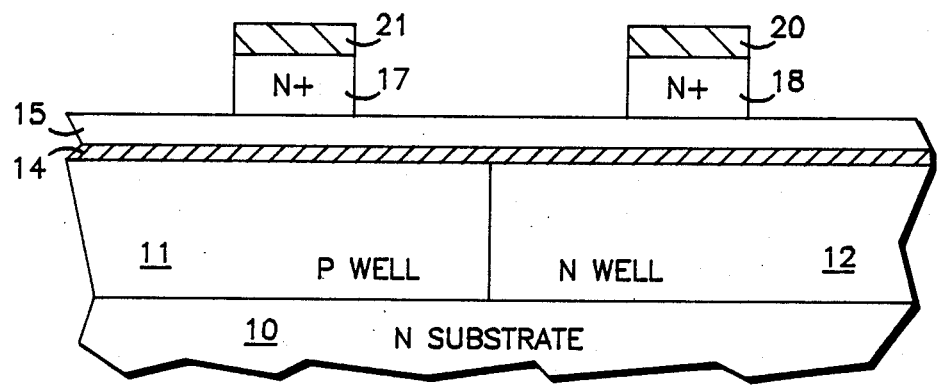

Shown in FIG. 1(B) is a cross-sectional view of the semiconductor structure after a second layer of polysilicon is deposited, patterned and selectively etched. It should be well understood that the present invention may be implemented in other forms including the deposition of a single layer of polysilicon having first and second thicknesses with first and second doping concentrations, respectively, performed in-situ. The relative thicknesses of the layers having differing doping concentrations may be reversed from that shown in FIG. 1. Also, a single deposition of insitudoped polysilicon rather than two distinct layered depositions may be made wherein the doping concentrations of the polysilicon are varied during the single deposition. Gate electrodes 17 and 18 comprised of N+ doped polysilicon are formed. The patterning of the doped layer of polysilicon is accomplished by depositing a layer of conventional photoresist material, such as photoresist layers 20 and 21, over the doped polysilicon where gate electrodes 18 and 17 are respectively desired to be formed. The doping sensitive endpoint etch of the doped layer of polysilicon forms gate electrodes 17 and 18 but leaves the layer of undoped polysilicon over the remaining top surface of the semiconductor structure. Therefore, the present invention provides an effective method for etching the doped polysilicon layer which is used to form gate electrodes 17 and 18 without also etching away the layer of undoped polysilicon 15. As will be shown below, it is very important to the present invention that undoped polysilicon 15 not be removed at this time.

The selective etching of the doped polysilicon layer to form gate electrodes 17 and 18 is accomplished by an etching process which uses a doping sensitive endpoint. The semiconductor structure is placed in a conventional etching system such as a parallel plate etcher. An etchant gas is used to perform a selective etch where photoresist is not placed from which gate electrodes 17 and 18 are formed. The etch is substantially anisotropic. During the etch, two basic reactions occur. The primary etchant is a fluorine containing species, such as SF6, which reacts with polysilicon to form volatile fluorides of silicon as follows:

$$SF_m + Si \rightarrow SiF_n + \text{Volatile Sulfur Compounds} \quad (1)$$

where "m" is an integer between one and six inclusive, and "n" is an integer between one and four inclusive. The optical emissions from the plasma is filtered so that only the wavelengths associated with the $SiF_n$ species reaches a photodetector. Because the undoped polysilicon is less conductive than the doped polysilicon, the $SF_6$ plasma reacts more slowly when it reaches the undoped polysilicon layer 15. As the reaction slows down, the $SiF_n$ emissions decrease. In order to amplify the early endpoint signal, a second etchant gas can be added to the etch plasma. This gas is preferably a chlorinated freon compound, such as $CFCl_3$. In the plasma, this gas can be added to the etch plasma. This gas is preferably a chlorinated freon compound, such as $CFCl_3$. In the plasma, this gas dissociates into subfluorides and subchlorides of carbon, which react with the polysilicon to form volatile subfluorides and subchlorides of silicon as follows:

$$CF_w + CCl_x + Si \rightarrow SiF_y + SiCl_z + \text{Volatile Carbon Compounds} \quad (2)$$

where w, x, y and z are integers between one and four, inclusive. The optical emissions from the plasma is sent through a second filter so that only the wavelengths associated with the CClx species reaches a second photodetector. As previously described, the reaction stated by equation two will also slow down when the etch plasma reaches the undoped polysilicon layer 15. In this case, however, the emission from the reactant CClx increases and reaches a maximum at the approximate midpoint of layer 15. By ratioing these two divergent emission signals, $V_{SiFn}/V_{CClx}$, the amplitude of the early endpoint signal can be significantly amplified. Therefore, the ratio of fluorine to chlorine emissions is magnified when etching between doped and undoped polysilicon layers and specific etch points between differing doped layers can be easily and accurately detected. This doping sensitive technique can also apply to a technique which is a chlorine based etch chemistry.

In the illustrated form, by having the undoped polysilicon layer 15 remain on the top surface of the gate oxide 14, the etching process used to form gate electrodes 17 and 18 does not penetrate or degrade the layer of gate oxide 14. Gate oxide 14 is also protected from potential rupturing associated with electrical charge build-up on the top surface of the oxide during source/drain implantation. It should be understood that the doping sensitive endpoint etching of the gate electrode material may be implemented by using more than two regions or distinct layers of doping concentrations. For example, the gate electrode material may be formed from three regions of differing doping concentrations so that a transition into and out of a middle region may be detected. Further, the doping impurities are not limited to Group III or Group IV elements. Other doping impurities such as oxygen, nitrogen or carbon may be utilized.

Figure 1C:
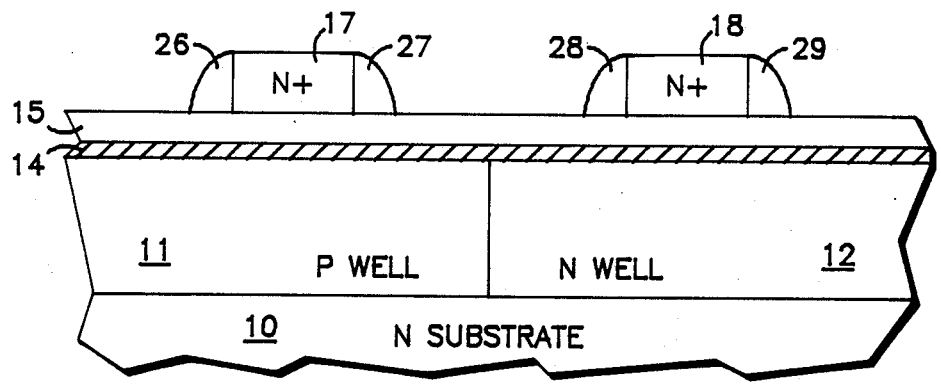

Shown in FIG. 1(C) is a cross-sectional view of the semiconductor structure after photoresist layers 20 and 21 are removed and sidewall spacers are formed at the sides of gate electrodes 17 and 18. Sidewall spacers 26 and 27 are formed adjacent gate electrode 17, and sidewall spacers 28 and 29 are formed adjacent gate region 18. In one form, sidewall spacers 26-29 are formed of a low temperature oxide (LTO) which is uniformly deposited over polysilicon layer 15 and gate electrodes 17 and 18. It should be well understood that many types of materials may be utilized as sidewall spacers including any type of low temperature oxide, a photographically enhanced oxide, a refractory metal or a nitride. Any type of material which can be etched selectively over polysilicon may be utilized. A reactive ion etch may be performed to remove the LTO above the undoped polysilicon layer 15. At the interface of the LTO and doped polysilicon gate electrodes 17 and 18, the reactive ion etch is sufficiently slow as compared to the remaining top surface of undoped polysilicon layer 15 to form the sidewall spacers 26-29. Although the LTO may have any predetermined thickness in a wide range of values, a typical thickness for the LTO is in the range of one thousand to four thousand angstroms.

Figure 1D:
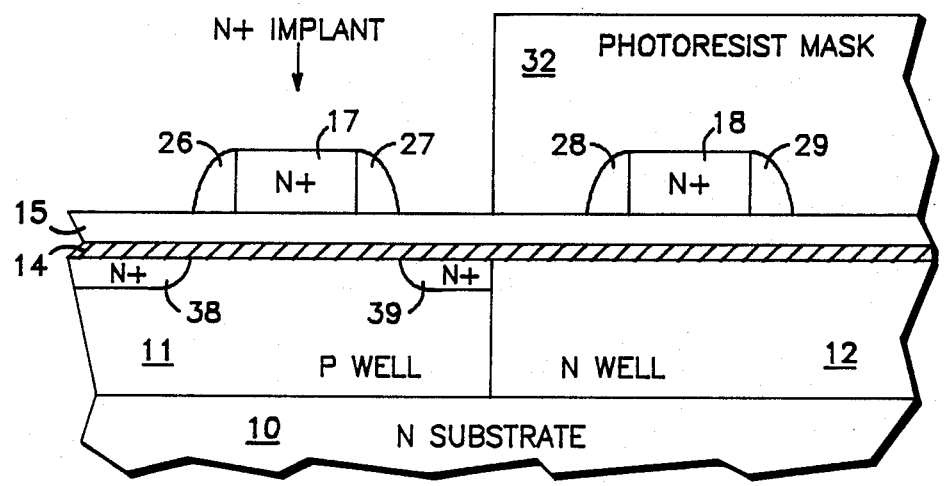

Shown in FIG. 1(D) is a cross-sectional view of the semiconductor structure after a photoresist mask 32 has been placed over the semiconductor structure substantially above the N conductivity well region 12. The semiconductor structure is then subjected to an N+ ion implant which forms diffusions 38 and 39 of N+ conductivity. Diffusions 38 and 39 are respectively aligned to the edges of sidewall spacers 26 and 27.

Figure 1E:
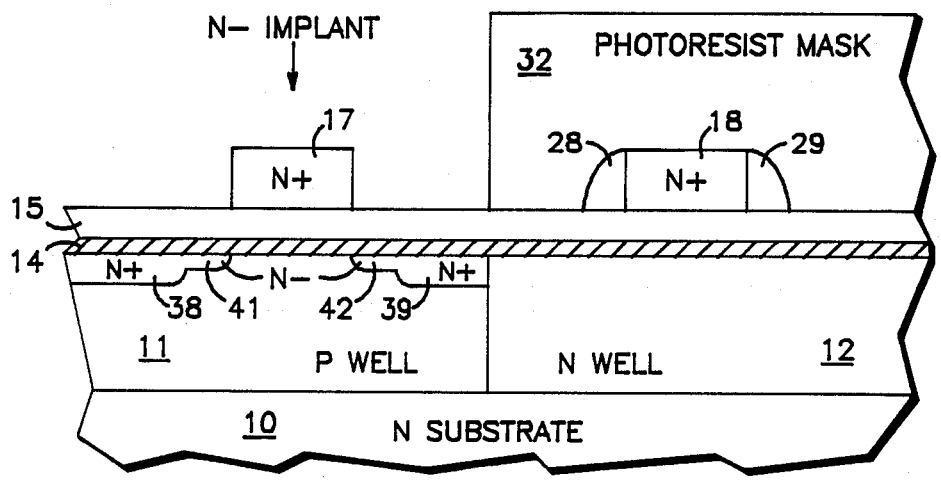

Shown in FIG. 1(E) is a cross-sectional view of the semiconductor structure after sidewalk spacers 26 and 27 are removed from gate region 17. Sidewall spacers 26 and 27 may e washed off from gate region 17 and undoped polysilicon layer 15 by a solution of hydrogen fluoride, HF. By using a wet etch of the sidewall spacers 26 and 27, there is no inadvertent etching of gate regions 17 and 18 as is common when a reactive ion etch is required. Also, a wet etch of sidewall spacers provides reliable, efficient manufacturability. The semiconductor structure is then subjected to a selective N− ion implant whereby diffusions 41 and 42 of N− conductivity are formed. Diffusions 41 and 42 are each aligned to the one of the two sides of gate electrode 17. Photoresist mask 32 remains in place substantially above the N conductivity well region 12 during the formation of the LDD transistor in the P well region 11. The semiconductor wafer is thus not subjected to a radiation environment during the selective implants.

Figure 1F:
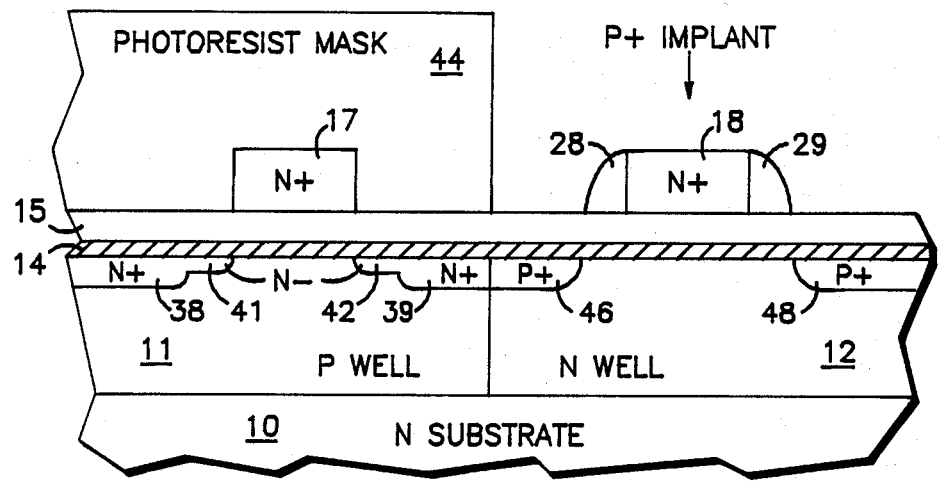

Shown in FIG. 1(F) is a cross-sectional view of the semiconductor structure wherein photoresist mask 32 has been removed and a photoresist mask 44 is placed over well region 11. The semiconductor structure is then subjected to a P+ ion implant which forms diffusions 46 and 48 of P+ conductivity. Diffusions 46 and 48 are respectively aligned to the sides of sidewall spacers 28 and 29.

Figure 1G:
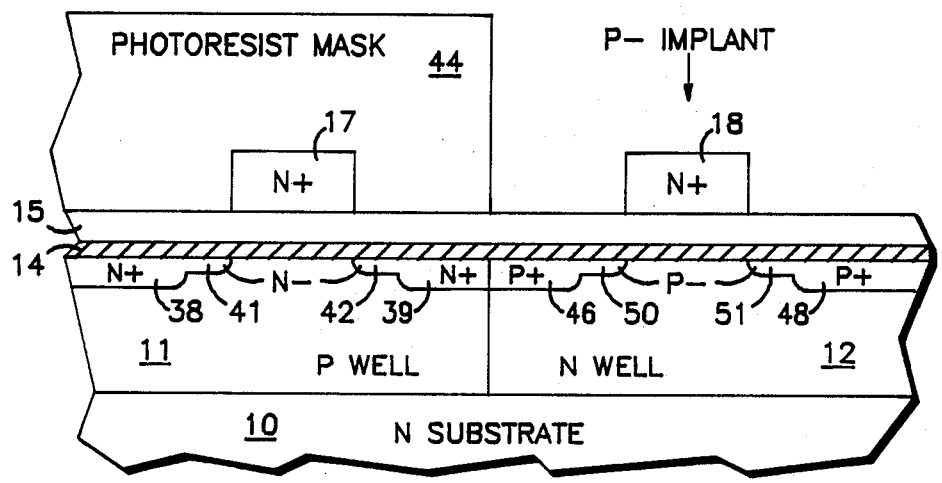

Shown in FIG. 1(G) is a cross-sectional view of the semiconductor structure after sidewall spacers 28 and 29 are removed from gate region 18. Sidewall spacers 28 and 29 are also readily removable from the sides of gate region 18 by using the solution of hydrogen fluoride, HF. Photoresist mask 44 remains in place over well region 11. The semiconductor structure is then subjected to a P− ion implant which form diffusions 50 and 51 of P− conductivity. Diffusions 50 and 51 are each aligned to one of the two sides of gate region 18.

Figure 1H:
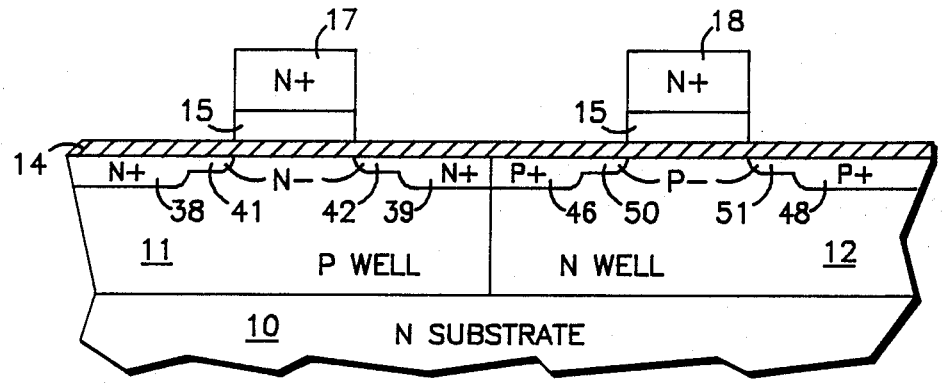

Shown in FIG. 1(H) is a cross-sectional view of the semiconductor structure after photoresist mask 48 is removed. During the previous process steps, the undoped layer of polysilicon 15 has been in place over the gate oxide layer 14 to protect the gate oxide during the diffusions described above. As a result, gate oxide layer 14 is structurally intact after the formation of an LDD transistor in both well region 11 and well region 12. A further advantage of having the layer of undoped polysilicon 15 in place above gate oxide layer 14 relates to protection from electric charge buildup. The ion implant steps described above may be done using a commercially available implanter. Clamps of the implanter which function to position and hold the semiconductor device must be fastened to edges of the semiconductor wafer on which the semiconductor is being fabricated. In the present invention, the clamps of the implanter make contact with the undoped polysilicon layer 15 rather than the gate oxide layer 14. The undoped polysilicon layer 15 creates a ground plane for directing charge created from the source/drain implants away from the gate oxide layer 14. Therefore, charge associated with the ion implanted diffusions does not have an opportunity to collect on the gate oxide layer 14 and rupture layer 14. In FIG. 1(H), the undoped polysilicon has been conventionally etched. Although the etch removes a small quantity of polysilicon from the top surface of gate electrodes 17 and 18, the gate electrodes 17 and 18 are left substantially intact. At this point, gate oxide layer 14 is now exposed and is the top layer of the semiconductor structure. However, the processing of the LDD transistors, an N− channel transistor in well region 11 and a P− channel transistor in well region 12, is virtually complete.

Figure 1I:
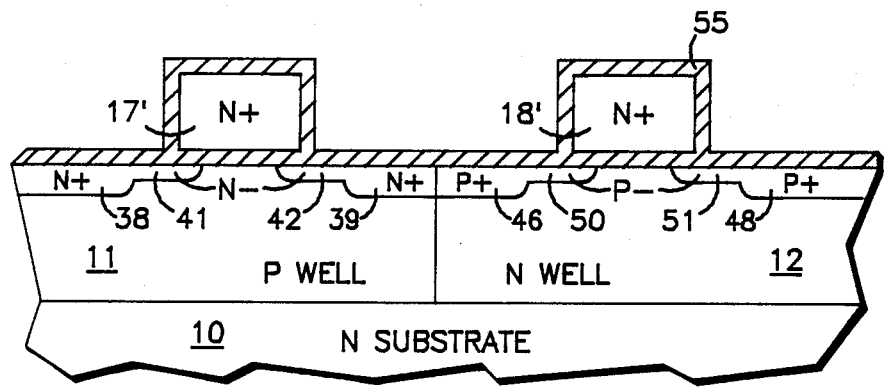

Shown in FIG. 1(I) is a cross-sectional view of the completed semiconductor structure in the fabrication of an LDD N-channel transistor and an LDD P-channel transistor. The structure is reoxidized with an oxide layer 55 to insure the integrity of the oxide surrounding the corners of gate electrodes 17 and 18. The structure is then annealed wherein the N+ polysilicon of gate electrodes 17 and 18 diffuses with the undoped polysilicon layer 15 to form N+ gate electrodes 17' and 18', respectively.

In the illustrated form, the above described process provides the inherent advantages associated with removable gate sidewall spacers which can be washed off in an HF solution. The gate oxide layer 14 is protected during the gate sidewall spacer formation and removal and also during all the ion implant steps. The protective undoped polysilicon layer 14 provides a ground plane during the ion implant which prevents electric charge rupture of gate oxide layer 14. By using the doping sensitive endpoint etching described above, a thin, planar layer of undoped polysilicon can always be assured to remain above the gate oxide until the final reoxidation and anneal step. Although various thicknesses of the undoped polysilicon layer can be accurate chosen, a thickness of approximately five hundred angstroms will adequately protect the gate oxide in most applications. It should be appreciated that although a CMOS LDD process is illustrated, the present invention may be utilized to provide only N− channel LLD transistors if desired and conventional P− channel transistors used otherwise.

Shown in FIG. 2 are cross-sectional views of another transistor structure commonly referred to as an inverse-T gate structure LLD transistor (ITLDD) which uses an undoped polysilicon layer provided by using the doping sensitive endpoint described above. In FIG. 2(A) is a cross-sectional view of the initial formation of the ITLDD structure. An N conductivity substrate 60 is provided wherein a P conductivity well region 61 and an N conductivity well region 62 is formed. A gate oxide layer 63 is grown on a top surface of the well regions 61 and 62. Above the gate oxide layer 63 is grown a relatively shallow layer 65 of undoped polysilicon. In one form, a layer of approximately five hundred angstroms is grown.

Figure 2A:
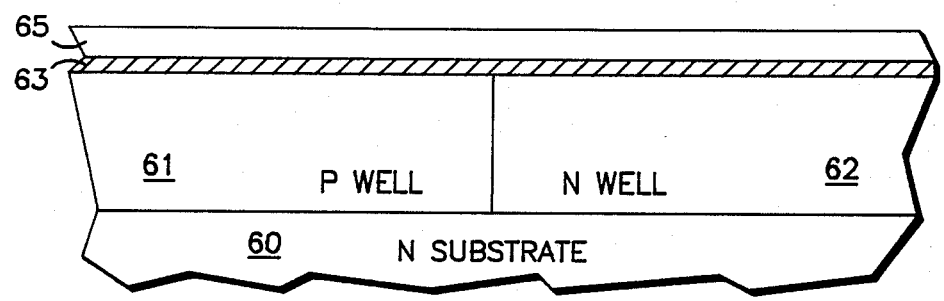
FIGS. 2(A)-(H) illustrate in cross-sectional diagram form the fabrication of an LDD transistor in accordance with another embodiment of the present invention.
Figure 2B:
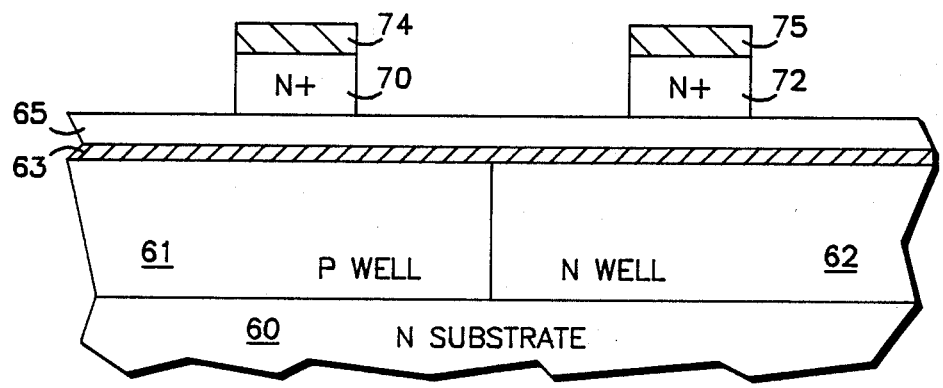

Shown in FIG. 2(B) is a cross-sectional view of the ITLDD structure after N+ doped polysilicon gate electrodes 70 and 72 have been formed. Gate electrodes 70 and 72 are formed by depositing a blanket planar layer of N+ polysilicon and using photoresist 74 and 75 to respectively mask off gate electrodes 70 and 72 during an etch of the layer of N+ polysilicon. The etch of the N+ polysilicon layer is done by using the doping sensitive endpoint process described above in connection with FIG. 1. As soon as N+ polysilicon layer is etched where photoresist 74 and 75 is not placed, the undoped polysilicon layer 65 is reached and the chemical reaction described above provides an easily detectable indicator of the transition between layers.

Figure 2C:
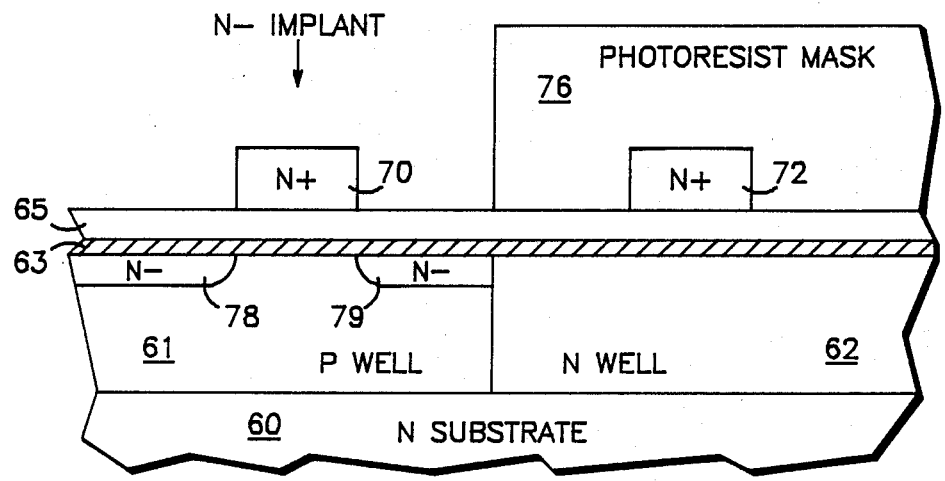

Shown in FIG. 2(C) is a cross-sectional view of the ITLDD structure after a photoresist mask 76 is placed over N well region 62. The remainder of the semiconductor structure is subjected to a selective N− implant to respectively form source/drain diffusions 78 and 79 of N− conductivity. The source/drain diffusions are aligned to the side edges of gate electrode 70.

Figure 2D:
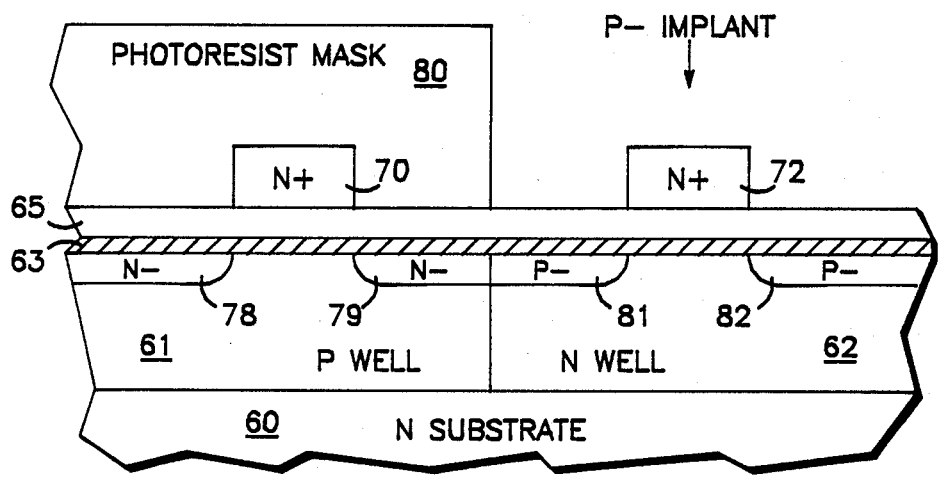

Shown in FIG. 2(D) is a cross-sectional view of the ITLDD structure after photoresist mask 76 is removed and a photoresist mask 80 is placed over well region 61. The remainder of the semiconductor structure is subjected to a selective P− implant to respectively form source/drain diffusions 81 and 82 of P− conductivity. The source/drain diffusions are aligned to the side edges of gate electrode 72.

Figure 2E:
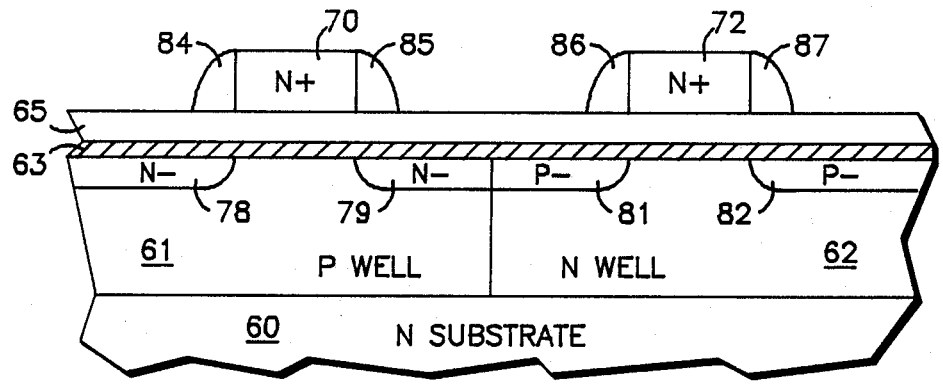

Shown in FIG. 2(E) is a cross-sectional view of the ITLDD structure after photoresist mask 80 is removed and sidewall spacers 84 and 85 are formed on the sides of the N+ polysilicon of gate electrode 70. Sidewall spacers 86 and 87 are also formed on the sides of gate electrode 72. In one form, the sidewall spacers are comprised of low temperature oxide (LTO) and are deposited above the undoped polysilicon 65. As previously mentioned, other materials may be used to implement the sidewall spacers.

Figure 2F:
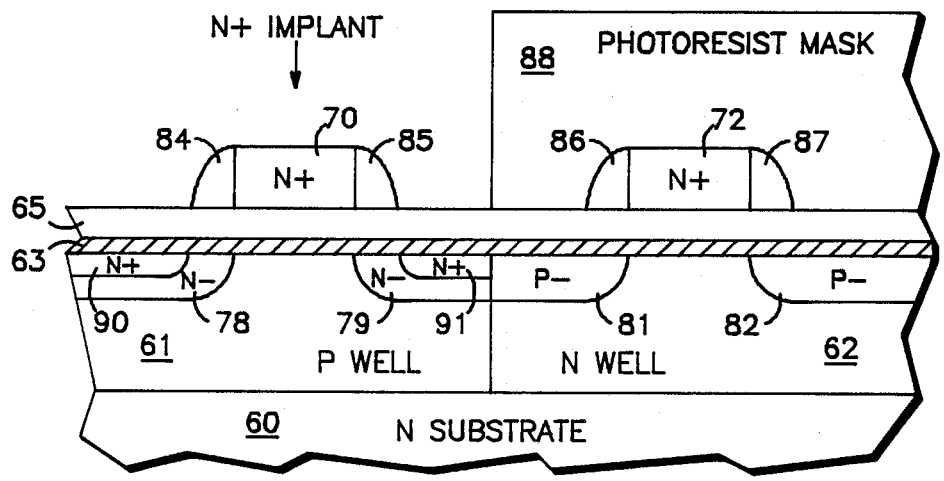

Shown in FIG. 2(F) is a cross-sectional view of the ITLDD structure after photoresist mask 88 is placed over the N well region 62. The remainder of the semiconductor structure is subjected to an N+ ion implant to form N+ diffusions 90 and 91 in P well region 61. Due to the masking action of sidewall spacers 84 and 85 and the gate electrode 70, the diffusions 90 and 91 respectively align with the outside edges of sidewall spacers 84 and 85.

Figure 2G:
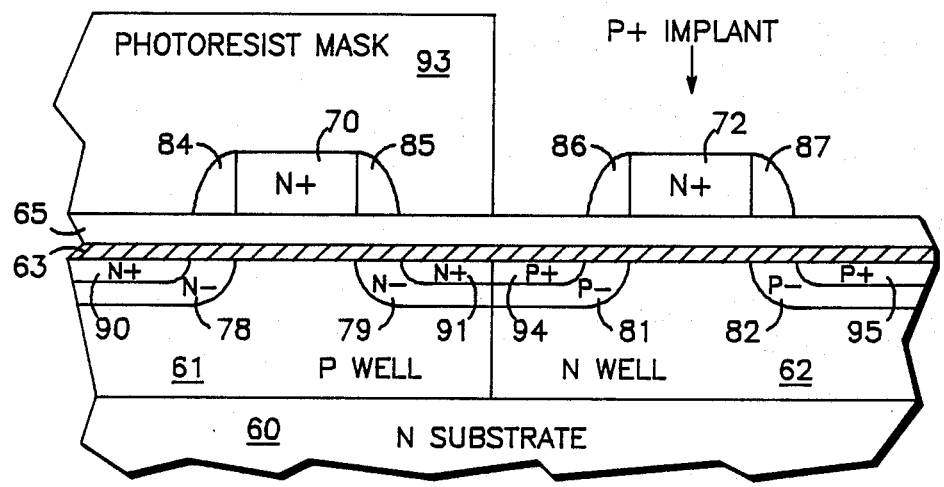

Shown in FIG. 2(G) is a cross-sectional view of the ITLDD structure after photoresist mask 88 is removed and a photoresist mask 93 is placed over the P well region 61. The remainder of the semiconductor structure is subjected to a P+ ion implant to form P+ diffusion 94 and 95 in N well region 82. Due to the masking action of sidewall spacers 86 and 87 and gate electrode 72, the diffusions 94 and 95 respectively align with the outside edges of sidewall spacers 86 and 87.

Figure 2H:
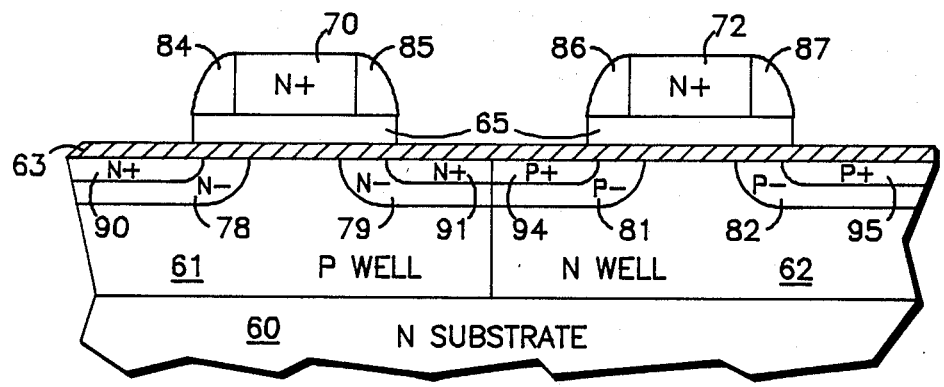

Shown in FIG. 2(H) is a cross-sectional view of the completed ITLDD structure wherein photoresist mask 93 is removed. The undoped polysilicon layer 65 is etched where exposed at the top surface of the structure so that gate oxide 63 is exposed at the top surface adjacent both sidewall spacers 84 and 85 and adjacent sidewall spacers 86 and 87. A CMOS ITLDD structure is thus provided.

The inverse-T gate structure LDD transistor allows a lower N− implant level which results in a transistor with a higher breakdown voltage and better hot carrier injection performance. The inverse-T gate structure LDD described herein uses self-aligning LDD implants and is easily manufacturable and reliable. By selectively etching the doped and undoped polysilicon layers using a doping sensitive endpoint, the initially unetched polysilicon layer protects the gate oxide during device fabrication so that gate oxide layer 63 has improved integrity and does not get overly etched.

Shown in FIG. 3 are cross-sectional views of another embodiment of the present invention for providing an LDD transistor structure. The LDD transistor structure of FIG. 3 may be implemented with two masks and only two implant stpes. In FIG. 3(A) is a cross-sectional view of the initial formation of the LDD structure. An N conductivity substrate 100 is provided wherein a P conductivity well region 101 and an N conductivity well region 102 is formed. A gate layer 104 is grown on a top surface of the well regions 101 and 102. Above the gate oxide layer 104 is formed a relatively shallow layer 106 of undoped polysilicon. In one form, a layer of approximately five hundred angstroms is grown.

Figure 3A:
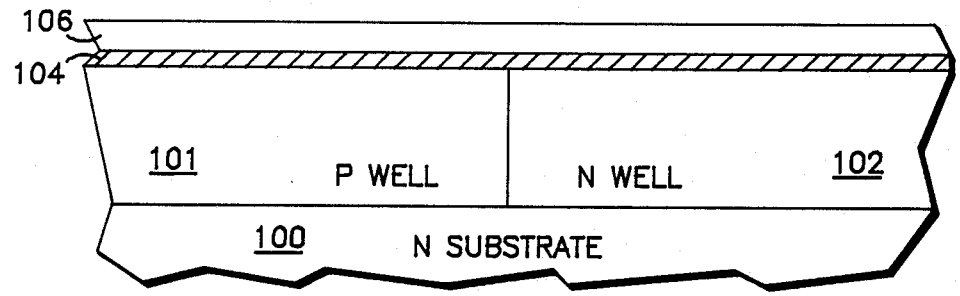
FIGS. 3(A)-(G) illustrate in cross-sectional diagram form the fabrication of an LDD transistor having an inverse T-gate structure.
Figure 3B:
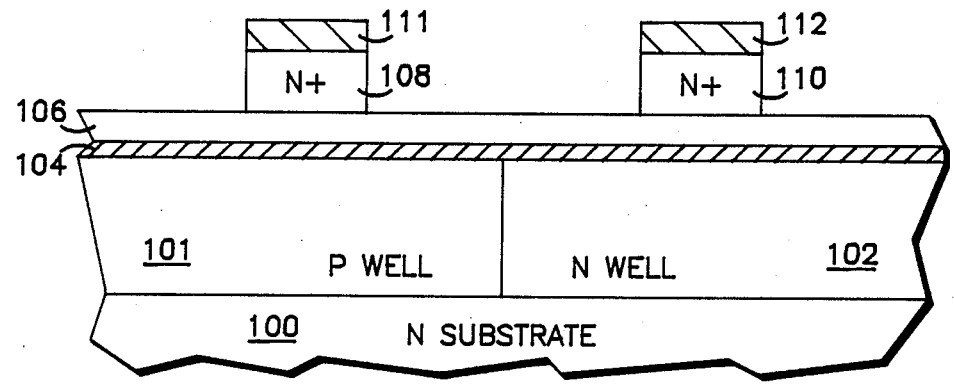

Shown in FIG. 3(B) is a cross-sectional view of the LDD transistor structure after N+ doped polysilicon gate electrodes 108 and 110 have been formed. Gate electrodes 108 and 110 are formed by depositing a blanket layer of N+ polysilicon and using photoresist 11, and 112 to respectively mask off gate electrodes 108 and 110 during an etch of the layer of N+ polysilicon. The etch of the N+ polysilicon layer is done by using the doping sensitive endpoint process described above. As soon as the N+ polysilicon layer is etched where photoresist 111 and 112 is not placed, the undoped polysilicon 106 is reached and the chemical reaction described above provides an easily detectable indicator of the transition between layers so that polysilicon 106 can be left a protection layer for gate oxide 104.

Figure 3C:
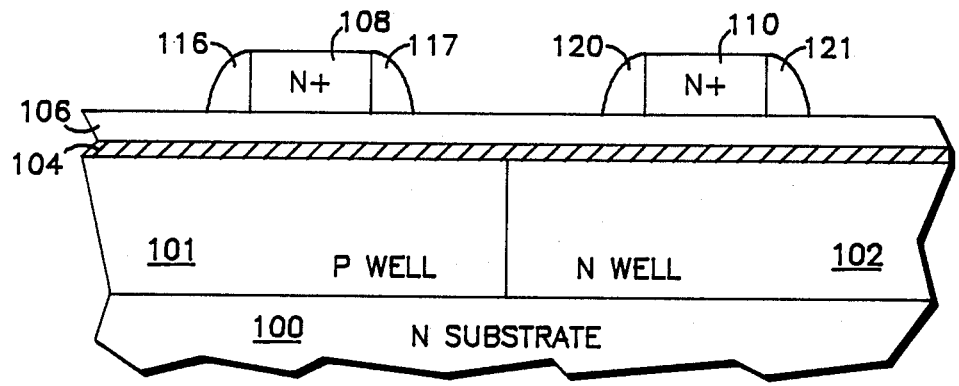

Shown in FIG. 3(C) is a cross-sectional view of the LDD transistor structure after silicon nitride sidewalls spacers 116 and 117 are formed around the sides of the gate electrode 108 and sidewall spacers 120 and 121 are formed around the sides of gate electrode 110. Although sidewall spacers of other material may be used, a sidewall spacer which may be subsequently removed without reacting with gate oxide is desired. Silicon nitride is one possible material which meets this criteria.

Figure 3D:
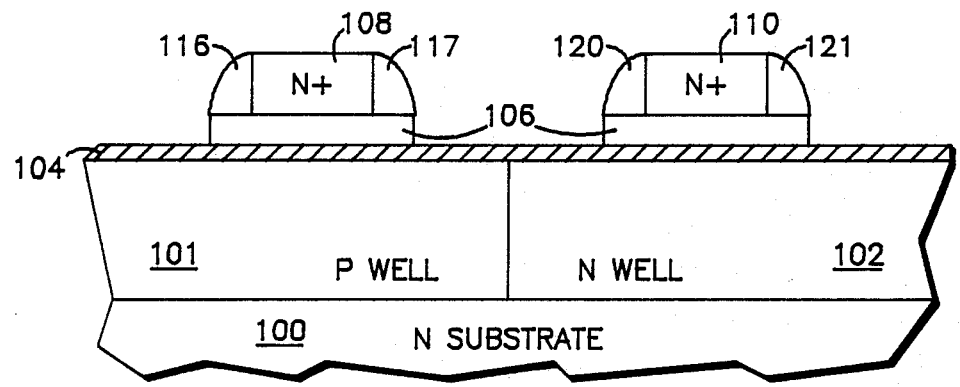

Shown in FIG. 3(D) is a cross-sectional view of the LDD transistor structure after the undoped polysilicon 106 is etched to expose gate oxide 104. The portions of undoped polysilicon 106 which are under gate electrodes 108 and 110 and sidewall spacers 116, 117, 120 and 121 are not etched.

Figure 3E:
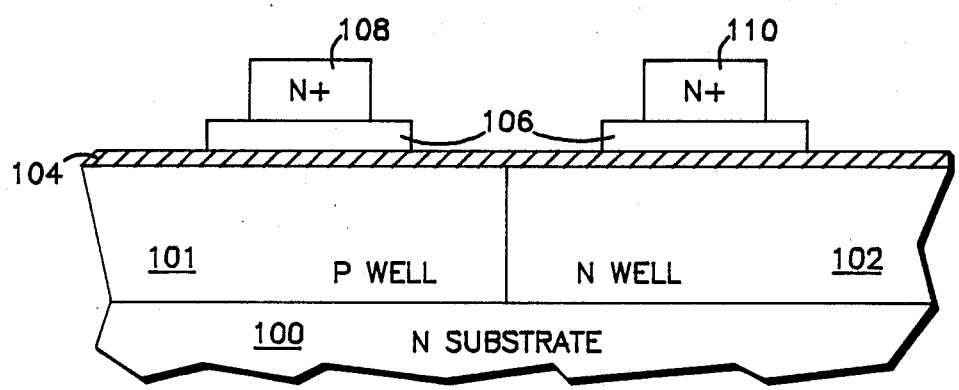

Shown in FIG. 3(E) is a cross-sectional view of the LDD transistor structure after the sidewall spacers 116, 117, 120 and 121 are removed. Since sidewall spacers 116, 117, 120 and 121 are comprised of a material which can be etched without damaging the integrity of the gate oxide layer 104. The removal of the sidewall spacers without etching gate oxide layer 104 is very important.

Figure 3F:
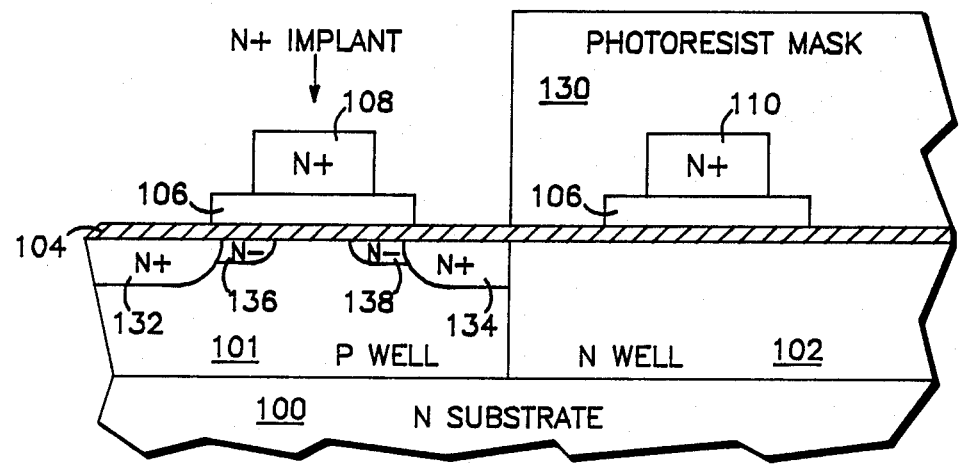

Shown in FIG. 3(F) is a cross-sectional view of the LDD transistor structure after a photoresist mask 130 is placed over the N-well region 102. The remainder of the semiconductor structure is subjected to an N+ ion implant to form both N+ source/drain diffusions 132 and 134 and N− source/drain diffusions 136 and 138. The N+ diffusions 132 and 134 respectively align substantially with the sides of the undoped polysilicon 106 below gate electrode 108. Adjacent the N+ diffusions 132 and 134 are N− diffusions 136 and 138 which respectively align substantially with the sides of gate electrode 108. The N− diffusions 136 and 138 are formed concurrently with N+ diffusions 132 and 134 in P-well region 101 as a result of less penetration of the N+ doping thru the undoped polysilicon 106 which is adjacent the sides of gate electrode 108 and thru gate oxide layer 104 into P-well region 101. Therefore, an LDD N-channel transistor is formed around gate electrode 108 in a single ion implant step.

Figure 3G:
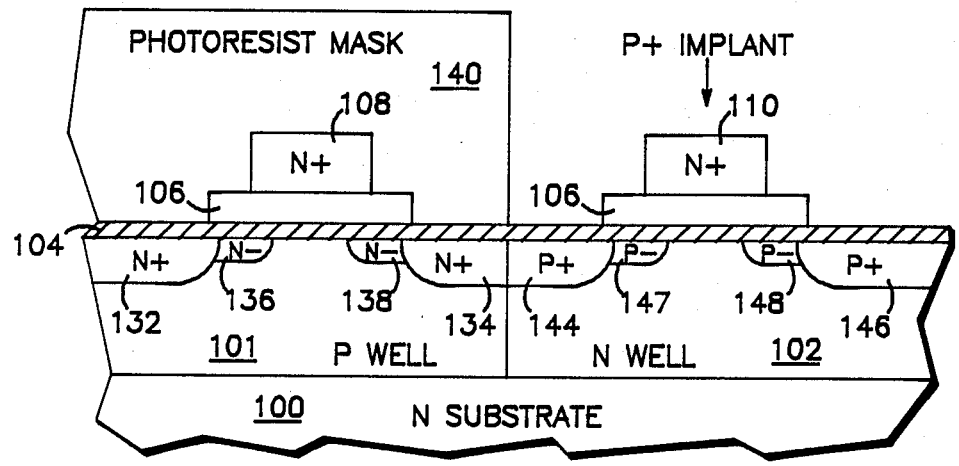

Shown in FIG. 3(G) is a cross-sectional view of the LDD transistor structure after photoresist mask 130 is removed and a photoresist mask 140 is placed over the P-well region 140. The remainder of the semiconductor structure is subjected to a P+ ion implant to form both P+ source/drain diffusions 144 and 146 and P− source/drain diffusions 147 and 148. The P+ diffusions 144 and 146 respectively align substantially with the sides of the undoped polysilicon 106 below gate electrode 110. Adjacent the P+ diffusions 144 and 146 are diffusions 147 and 148 which respectively align substantially with the sides of gate electrode 110. The P− diffusions 147 and 148 are formed concurrently with P+ diffusions 144 and 146 in N-well region 102 as a result of less penetration of the P+ doping through the undoped polysilicon 106 which is adjacent the sides of gate electrode 110 nd thru gate oxide layer 104 in N-well region 102. Therefore, an LDD P-channel transistor is formed around gate electrode 110 in a single ion implant step. In the illustrated form, a CMOS inverse-T gate LDD transistor process requiring two photoresist masks and only two ion implant steps is provided. Mask count is thereby minimized and the gate oxide and gate electrode material is not damaged during the etch steps of the process.

In another form of the FIG. 3 embodiment of the present invention, undoped polysilicon 106 can be etched adjacent the sides of gate electrodes 108 and 110 and above the layer of gate oxide 104. Such an etch would modify the LDD transistors from an inverse-T gate structure to a conventional LDD structure. A benefit of the additional etch step would be to reduce source-to-gate and drain-to-gate overlap capacitance. The desirability of the additional etch step would depend upon the application. Also, the source/drain to gate overlap capacitance will vary as a function of the size of the N− diffusions 136 and 138. Therefore, the desirability of reducing the overlap capacitance must be compared with benefits otherwise provided by the inverse-T gate structure.

By now it should be apparent that a process involving the initially incomplete etch of gate electrode material for use in fabricating an LDD transistor has been provided. The process described herein provides protection to a gate oxide layer during implant and sidewall formation steps. By using an etching technique which has a doping sensitive endpoint, the gate oxide layer may be protected by a thin undoped polysilicon layer during the majority of the fabrication steps of the device. At the completion of the device, a reliable gate oxide layer exists.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of the invention.

We claim:

1. A process for forming a lightly doped drain (LDD) transistor by using impurity sensitive endpoint etching, comprising the steps of:
   providing a substrate of a first conductivity type;
   providing a well region of a second conductivity type in the substrate;
   forming a layer of gate dielectric over the well region;
   depositing a layer of gate electrode material over the layer of gate oxide, said layer of gate electrode material having first and second thicknesses, the first thickness having a first impurity concentration and the second thickness being not less than the first thickness with a second impurity concentration;
   patterning a gate electrode from the second thickness of gate electrode material by selectively depositing a pattern forming material onto a predetermined portion of the layer of gate electrode material;
   selectively etching by chemical etch reaction the first thickness of the layer of gate electrode material to form said gate electrode, thereby exposing a top surface of the first thickness of the layer of gate electrode material adjacent each side of said gate electrode, said selective etching implemented by monitoring either one of a chemical product or a chemical reactant of the chemical etch reaction or by monitoring a ratio of the chemical product and chemical reactant of the chemical etch reaction and detecting a change of a monitored value upon completion of etching the first thickness of the layer of gate electrode material;
   forming a lightly doped drain transistor around the gate electrode by implanting heavily and lightly doped source/drain regions of the first conductivity type, then completing the etching of the layer of gate electrode material to expose the layer of gate dielectric.

2. The process of claim 1 wherein the gate electrode material is polysilicon.

3. The process of claim 1 wherein the first impurity concentration is greater than the second impurity concentration.

4. The process of claim 1 wherein the second impurity concentration is greater than the first impurity concentration.

5. The process of claim 1 wherein the lightly doped transistor is formed by the steps of:
   forming sidewalls spacers adjacent the sides of the gate electrode;
   implanting heavily doped source/drain regions of the first conductivity type along edges of the sidewall spacers;
   removing the side wall spacers; and
   implanting lightly doped source/drain regions of the first conductivity type along the sides of the gate electrode.

6. The process of claim 5 wherein the sidewall spacers are comprised of low temperature oxide material.

7. The process of claim 5 wherein the sidewall spacers are comprised of silicon nitride.

8. The process of claim 1 further comprising steps for making complementary conductivity LDD transistors comprising:
   providing a second well region of the first conductivity type in the substrate and electrically insulated from the first well region;
   forming the layer of gate dielectric to include covering over the second well region;
   depositing the layer of gate electrode material to include covering the layer of gate electrode dielectric over the second well region, said layer of gate electrode material having the first and second thicknesses of first and second impurity concentrations, respectively;
   patterning a second gate electrode from the second thickness of gate electrode material over a predetermined portion of the second well region by selectively depositing pattern forming material onto a second predetermined portion of the layer of gate electrode material;
   selectively etching by chemical etch reaction the first thickness of the layer of gate electrode material over the second well region to form the second gate electrode, said second etching also being implemented by monitoring either the chemical etch product of chemical reactant of the chemical etch reaction or monitoring a ratio of the chemical etch product and chemical reactant of the chemical etch reaction and detecting a change of a monitored value upon completion of etching the first thickness of the layer of gate electrode material;

forming a second lightly doped transistor around the second gate electrode by implanting heavily and lightly doped source/drain regions of the second conductivity type, then etching remaining gate electrode material to expose the layer of gate oxide above the second well region.

9. A process for forming a lightly doped drain transistor, comprising the steps of:

providing a substrate of first conductivity type;

forming first and second well regions of first and second conductivities, respectively, in the substrate;

forming a layer of gate dielectric over the well regions;

depositing a layer of gate electrode material over the layer of gate dielectric material having first and second thicknesses, the first thickness having a first impurity concentration and the second thickness being not less than the first thickness with a second impurity concentration;

patterning first and second gate electrodes over the first and second well regions, respectively, from the second thickness of gate electrode material by selectively depositing a pattern forming material onto first and second predetermined portions of the layer of gate electrode material;

selectively etching by chemical etch reaction the first thickness of the layer of gate electrode material to form the first and second gate electrodes, thereby exposing the layer of gate electrode material adjacent the first and second gate electrodes;

selectively implanting lightly doped source/drain diffusions of the first conductivity type into the first well region and adjacent the first gate electrode;

selectively implanting heavily doped source/drain diffusions of the second conductivity type into the second well region and adjacent the second gate electrode;

forming disposable sidewall spacers adjacent the sides of the first and second gate electrodes;

selectively implanting heavily doped source/drain diffusions of the first conductivity type into the first well region and adjacent outside edges of the sidewall spacers of the first gate electrode;

selectively implanting heavily doped source/drain diffusions of the second conductivity type into the second well region and adjacent outside edges of the sidewall spacers of the second gate electrode; and after said implantation steps, etching the second thickness of gate electrode material adjacent the first and second gate electrode to expose a top surface of the layer of gate dielectric.

10. The process of claim 9 wherein the first impurity concentration is greater than the second impurity concentration.

11. The process of claim 9 wherein the second impurity concentration is greater than the first impurity concentration.

12. The process of claim 9 wherein the gate electrode material is polysilicon.

* * * * *